United States Patent [19]
Challoner et al.

[11] 3,971,013
[45] July 20, 1976

[54] TOUCH KEYBOARD

[75] Inventors: Francis Loyola Challoner, Chandlers Ford, England; Hemmige Desikachar Varadarajan, Wappingers Falls, N.Y.

[73] Assignee: International Business Machines Corporation, Armonk, N.Y.

[22] Filed: Apr. 23, 1975

[21] Appl. No.: 570,990

[30] Foreign Application Priority Data
Oct. 1, 1974 United Kingdom............... 42541/74

[52] U.S. Cl........................... 340/337; 340/166 EL; 340/324 M; 340/343; 340/365 C; 313/201; 317/DIG. 2
[51] Int. Cl.².......................................... G08C 1/00
[58] Field of Search.......... 340/365 C, 337, 173 PL; 313/201

[56] References Cited
UNITED STATES PATENTS

| | | | |
|---|---|---|---|
| 2,847,615 | 8/1958 | Engelbart............................ | 313/201 |
| 3,207,905 | 9/1965 | Bray................................ | 340/365 C |
| 3,257,658 | 6/1966 | Lloyd.............................. | 340/365 C |
| 3,509,408 | 4/1970 | Holz................................. | 313/201 |

OTHER PUBLICATIONS

IBM Tech. Discl. Bull. vol. 3, No. 11, Apr., 1961, p. 31, Goddard, "Non–Mechanical Keyboard."

*Primary Examiner*—Thomas B. Habecker
*Attorney, Agent, or Firm*—Edward H. Duffield

[57] ABSTRACT

A touch operated keyboard comprising an AC driven gas discharge panel display with conductive touch keys located to pick up an AC voltage from the stray field generated by the gas discharge panel is disclosed. A detector detects the drop in AC voltage level of a key due to the proximity of an operator's finger. The touch keys may be deposited upon the surface of the gas panel or upon a separate transparent sheet. The keyboard may be operated to change the information displayed by the gas panel.

10 Claims, 6 Drawing Figures

| RECTIFIED SIGNAL TOUCHED | V SIG. |
| REFERENCE VOLTAGE | V REF. |
| RECTIFIED SIGNAL TOUCHED | V SIG. T |

TOUCH KEYBOARD

FIELD OF THE INVENTION

This invention relates to a touch keyboard. The touch keyboard makes use of the capacitance introduced when an operator touches a selected key. The great advantage of touch keyboards is that there are no moving parts and thus their reliability is high.

PRIOR ART

Cathode-ray tube displays are known in which sensing wires are attached to the screen of a data display cathode-ray tube. Each sensing wire is connected to a source of AC voltage associated with a detector circuit. The detector circuit is responsive to the body capacitance of an operator touching one of the wires to generate a signal which controls the actual data displayed. U.K. Pat. Specification Nos. 1,288,925 and 1,311,713 described cathode-ray tube displays of this type. Other general prior art showing touch keyboards are U.S. Pat. Nos. 3,757,322, 3,482,241, 3,382,588, 3,244,369, 3,846,791, and 2,659,533.

Touch operated displays have application in data processing systems where human operators are required to communicate with data processing devices.

OBJECTS OF THE INVENTION

It is an object of this invention to provide an improved touch keyboard and display.

Another object of the invention is to provide an improved means of energizing the touch keys used with a gas discharge panel type displays.

SUMMARY OF THE INVENTION

According to the present invention, there is provided a touch operated keyboard comprising an AC driven gas discharge panel display, at least one conductive touch key located to pick up an AC voltage from the stray field generated by the gas discharge panel, and means to detect the drop in AC voltage level of at least one key due to the proximity of an operator's finger.

In order that the invention may be more readily understood, reference will now be made, by way of example, to the accompanying drawings.

SPECIFICATION

Figure 1:
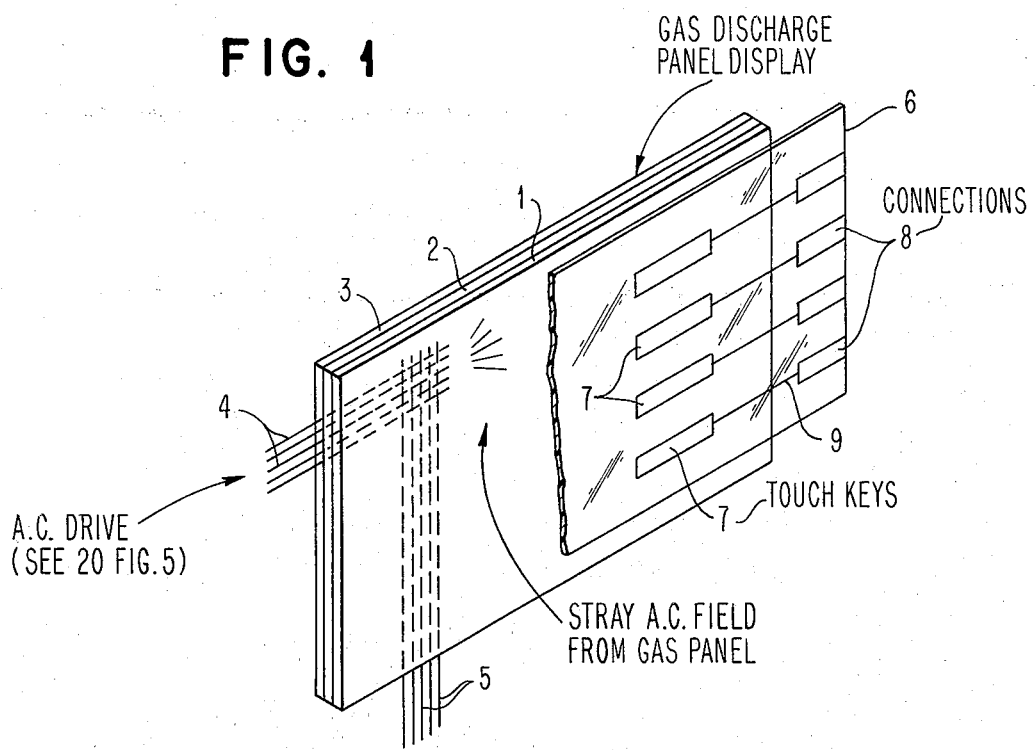
FIG. 1 illustrates a touch operated keyboard embodying the invention.

Referring now to FIG. 1, which illustrates a touch operated keyboard embodying the invention, this figure shows a gas discharge panel 1. Only a brief description of a gas discharge panel will be given here, but a detailed description of the construction of a gas discharge panel will be found in U.K. Pat. Specification No. 1,258,219, entitled, "Gas Panel Display Device." Other gas discharge display patents teaching how such a device is constructed and operated are U.S. Pat. Nos. 3,559,190 and 3,837,724.

Gas discharge panel 1 consists of spaced apart front glass plate 2 and rear glass plate 3 which are sealed around the edges to provide a sealed envelope. A number of horizontal conductors 4 and vertical conductors 5 which are spaced apart from each other extend through the sealed envelope. The gas discharge panel 1 includes an ionizable gas within the sealed envelope and regions in the vicinity of coordinate intersections of horizontal conductors 4 and vertical conductors 5 define gas discharge sites which we will call gas cells. A gas cell is ignited and illuminated by a write operation by applying half select voltages to its respective horizontal and vertical conductors to provide a potential difference across the gas cell which exceeds the ignition potential of the cell. Once ignited, a gas cell is maintained in this condition by a periodic sustain voltage continuously applied to all horizontal and vertical conductors. An ignited gas cell is extinguished during an erase operation when zero potential is applied across the cell.

By selective write operations, information may be visibly displayed on the gas discharge panel 1 in the form of characters, symbols, lines and the like. U.K. Pat. Specification No. 1,317,663, entitled, "Gas Discharge Panel Display" provides a detailed description of gas discharge panel operation.

A sheet 6 of glass, Mylar (Registered Trade Mark) or similar transparent insulating material is located on the surface of front glass plate 2. Sheet 6 has a conductive film deposited upon its surface to form touch keys 7, edge connections 8 and interconnecting lines 9. The conductive film is preferably transparent and deposited gold has been found suitable. Other conductive substances such as transparent tin oxide are well-known. To avoid wear of the conductive keys 7, sheet 6 is placed with the conductive film in contact with front glass plate 2.

Alternatively, a conductive film may be deposited directly on the outer surface of front glass plate 2 to form touch keys 7, edge connections 8 and interconnecting lines 9. A protective sheet of glass or Mylar (Registered Trade Mark) or other transparent insulating material is then placed over the deposited conductive film.

When the gas discharge panel 1 is operating, a periodic sustain voltage is applied to all horizontal conductors 4 and vertical conductors 5. This periodic sustain voltage is typically a square wave having a repetition rate of 30K Hz. This AC operation of gas discharge panel 1 generates a stray external field in which touch keys 7 are located. Thus, touch keys 7 will pick up an AC signal voltage which is connected to edge connections 8.

Figure 2A:
FIGS. 2A and 2B show the AC signal waveform picked up by a touch key when untouched and touched respectively.
Figure 2B:

It has been found that the AC signal voltage picked up by touch keys 7 is constant over most of gas discharge panel 1 for a given touch key size and is proportional to touch key area. This AC signal voltage is substantially independent of the state of illumination of the individual gas cells. By selecting the areas of the touch keys according to position, it is arranged that all touch keys 7 pick up the same AC signal voltage which typically has an amplitude of 20 volts. An actual AC signal voltage waveform is shown in FIG. 2A. When an operator touches a touch key 7, the AC signal voltage picked up by the touch key falls to less than 50% of the AC signal voltage of the key in the untouched condition as shown in FIG. 2B. This is due to the capacitive loading of the touch key by the body of the operator.

This AC signal voltage is detected by a detector circuit connected to edge connection 8. The detector circuit generates a binary signal which may be used to control the information displayed by the gas discharge.

Figure 3:
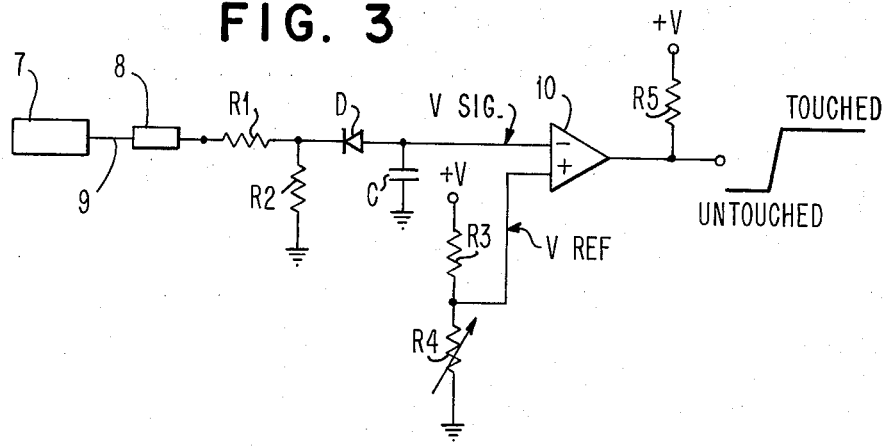
FIG. 3 is a circuit diagram of a detector circuit connected to a touch key.

A suitable detector circuit is shown in FIG. 3. In the Figure, touch key 7 is connected to edge connection 8 which supplies an AC signal voltage to resistor R1. Resistors R1 and R2 form a potential divider and provide a high resistance load for touch key 7. The reduced AC signal voltage at the junction of resistors R1 and R2 is rectified by diode D and smoothed by capacitor C to eliminate the 30 kHz ripple from the AC signal square wave voltage. Thus, a DC signal voltage is supplied to the −Ve input terminal of differential amplifier 10.

Figure 4:
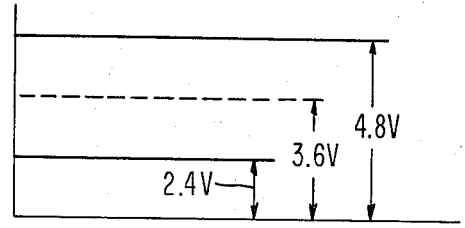
FIG. 4 shows the operating voltage levels of the detector circuit of FIG. 2.

When key 7 is untouched, a signal voltage as shown in FIG. 2A produces a rectified signal untouched Vsig of approximately 4.8 volts. When key 7 is touched (FIG. 2B) this voltage level falls to rectified signal touched VsigT of approximately 2.4 volts as shown in FIG. 4.

A reference potential Vref is applied to the +Ve terminal of differential amplifier 10. This reference potential Vref is generated from a voltage source +V by a variable potential divider R3 and R4 enabling Vref to be set at 3.6 volts, between Vsig and VsigT as shown in FIG. 4.

A load resistor R5 is connected between the output terminal of differential amplifier 10 and a voltage source +V. When rectified signal voltage untouched Vsig is present, it is inverted by amplifier 10 to turn on the output stage of amplifier 10 and produce a down level at its output terminal. A rectified signal touched VsigT turns output stage of amplifier 10 off to produce an up level at its output terminal. These output voltage levels can be made acceptable to conventional TTL logic circuits.

The following were used in the detector circuit of FIG. 3:

| Differential Amplifier 10 | ¼ Module MC 3302P By Motorola (Registered Trade Mark) |
| --- | --- |
| Resistors R1, R2 | 1MΩ |
| Resistor R3 | 200Ω |
| Resistor R4 | 5KΩ |
| Resistor R5 | 2.5KΩ |
| Capacitor C | 10 Kpf |
| +V | + 5 volts |

It has been found that the touch keyboard described herein has good noise immunity as the AC signal voltage on the touch keys is high and so a sensitive amplifier is not required. Also, external electrical noise and mains hum from the body of an operator have little effect.

Figure 5:
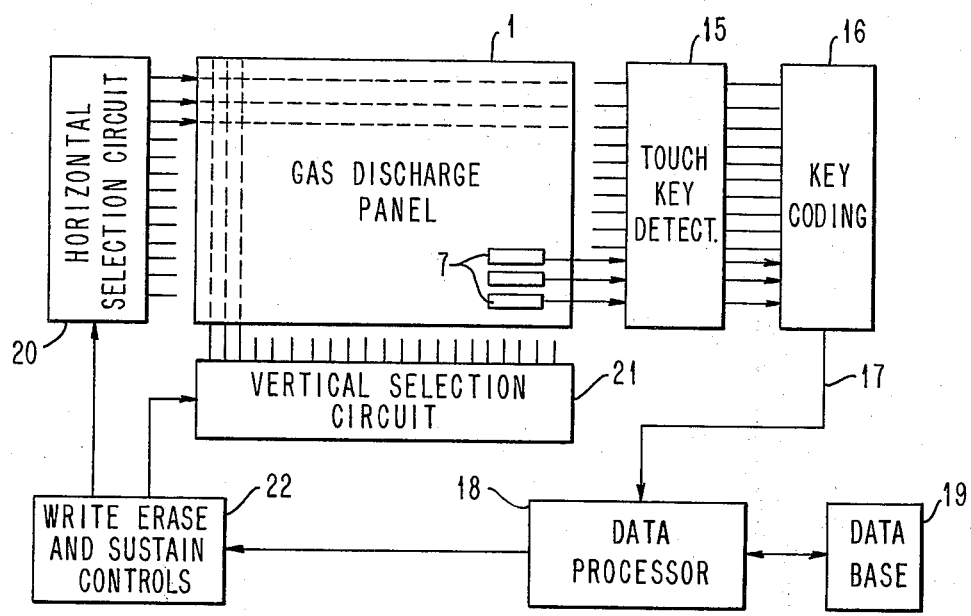
FIG. 5 is a block diagram of a touch operated display using the touch operated keyboard shown in FIG. 1.

FIG. 5 illustrates a touch operated display embodying the present invention. This figure is in block form and for details of the operation of a gas discharge panel display, the aforementioned U.K. Pat. No. 1,317,663 or the noted U.S. Pat. should be consulted. In FIG. 5, a gas discharge panel 1 has touch keys 7 as described with reference to FIG. 1. Each touch key 7 is connected to a detector circuit as in FIG. 3 denoted by block 15. The binary outputs of the detector circuits feed a key coding device 16 which is known in the art, and which generates an N bit code on N lines 17 indicative of key position.

The N lines 17 are a data input to data processor 18 which is associated with a data base 19. Data processor 18 supplies command signal S to Write, Erase and Sustain Controls 19 which operate the horizontal selection circuit 20 and vertical selection circuit 21 to illuminate individual gas discharge cells of gas discharge panel 1 as taught in the aforementioned patents.

Each touch key 7 is transparent and overlays a display position in which data from data base 19 may be displayed under the control of data processor 18. A display position can, therefore, be an information position or command position, the latter enabling "interactive" use of the device whereby the total information displayed can be determined by the key selection.

While the invention has been particularly shown and described with reference to a preferred embodiment thereof, it will be understood by those skilled in the art that various changes in form and details may be made therein without departing from the spirit and scope of the invention.

What is claimed is:
1. A touch operated keyboard comprising:
an AC driven gas discharge panel display;
at least one conductive touch key located proximate said display to pick up an AC voltage from said stray field generated by the gas discharge panel; and
means to detect the drop in AC voltage level of said at least one key due to the proximity of an operator's finger.

2. A keyboard as claimed in claim 1, in which each touch key overlays a display position on the gas discharge panel and the touch key is operable to change the information displayed in that position and/or any other positions.

3. A keyboard as claimed in claim 1 in which said conductive key comprises a metallic layer deposited upon a surface of the gas discharge panel.

4. A keyboard as claimed in claim 3, in which each touch key overlays a display position on the gas discharge panel and the touch key is operable to change the information displayed in that position and/or any other positions.

5. A keyboard as claimed in claim 3, in which said metallic layer is transparent.

6. A keyboard as claimed in claim 5, in which each touch key overlays a display position on the gas discharge panel and the touch key is operable to change the information displayed in that position and/or any other positions.

7. A keyboard as claimed in claim 1 in which said conductive key comprises a metallic layer upon a sheet of transparent insulating material, and; said transparent sheet is placed over the surface of said gas discharge panel.

8. A keyboard as claimed in claim 7, in which each touch key overlays a display position on the gas discharge panel and the touch key is operable to change the information displayed in that position and/or any other positions.

9. A keyboard as claimed in claim 7, in which said metallic layer is transparent.

10. A keyboard as claimed in claim 9, in which each touch key overlays a display position on the gas discharge panel and the touch key is operable to change the information displayed in that position and/or any other positions.

* * * * *